(12) United States Patent
Yeom

(10) Patent No.: US 11,923,247 B2
(45) Date of Patent: Mar. 5, 2024

(54) METHODS OF MANUFACTURING SEMICONDUCTOR CHIP INCLUDING CRACK PROPAGATION GUIDE

(71) Applicant: SK hynix Inc., Icheon-si (KR)

(72) Inventor: Hyo Sub Yeom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 359 days.

(21) Appl. No.: 17/469,362

(22) Filed: Sep. 8, 2021

(65) Prior Publication Data

US 2022/0352023 A1 Nov. 3, 2022

(30) Foreign Application Priority Data

May 3, 2021 (KR) .......................... 10-2021-0057547

(51) Int. Cl.
*H01L 21/78* (2006.01)
*H10B 43/27* (2023.01)
*H01L 21/82* (2006.01)
*H10B 43/40* (2023.01)

(52) U.S. Cl.
CPC ............. *H01L 21/78* (2013.01); *H10B 43/27* (2023.02); *H01L 21/82* (2013.01); *H10B 43/40* (2023.02)

(58) Field of Classification Search
CPC ..... H01L 21/78; H01L 23/562; H01L 23/585; H01L 21/82; H10B 43/27; H10B 43/40; B23K 26/53
See application file for complete search history.

(56) References Cited

U.S. PATENT DOCUMENTS

| | | | |
|---|---|---|---|
| 8,349,666 B1* | 1/2013 | Leal | H01L 24/05 257/E21.59 |
| 10,665,607 B1* | 5/2020 | Sugiura | H10B 43/50 |
| 2009/0146260 A1* | 6/2009 | Eto | H01L 23/585 438/622 |
| 2010/0025824 A1* | 2/2010 | Chen | H01L 21/78 257/E21.214 |
| 2013/0020674 A1* | 1/2013 | Leal | H01L 23/585 257/E23.149 |

FOREIGN PATENT DOCUMENTS

KR 1020200021273 A 2/2020

* cited by examiner

*Primary Examiner* — Thanh T Nguyen
(74) *Attorney, Agent, or Firm* — William Park & Associates Ltd.

(57) ABSTRACT

There may be presented a method of manufacturing a semiconductor chip. A first layer stack in which first material layers and second material layers are alternately stacked is formed over a semiconductor substrate including a chip region and a scribe lane region, and first crack propagation guides are formed on the first layer stack. A second layer stack is formed on the first layer stack and the first crack propagation guides, and second crack propagation guides are formed. A semiconductor chip is separated from the semiconductor substrate.

34 Claims, 20 Drawing Sheets

METHODS OF MANUFACTURING SEMICONDUCTOR CHIP INCLUDING CRACK PROPAGATION GUIDE

CROSS-REFERENCE TO RELATED APPLICATIONS

The present application claims priority under 35 U.S.C. 119(a) to Korean Applications No. 10-2021-0057547, filed on May 3, 2021, which is incorporated herein by reference in its entirety.

BACKGROUND

1. Technical Field

The present disclosure relates to a semiconductor technology, and more particularly, to a method of manufacturing a semiconductor chip including a crack propagation guide.

2. Related Art

Semiconductor devices are being integrated on a substrate, such as a wafer. Various attempts have been made to integrate semiconductor devices on a substrate in three dimensions. In order to increase the degree of integration of memory cells, three-dimensional (3D) semiconductor devices have been attempted. By dicing the substrate on which the semiconductor devices are integrated, a plurality of semiconductor chips including the semiconductor devices may be separated from the substrate. In order to reduce damage that may occur to the semiconductor chip when semiconductor chips are separated from the substrate, various types of dicing techniques have been attempted. For example, dicing techniques using a laser are being tried.

SUMMARY

According to an embodiment of the present disclosure, there is provided a method of manufacturing a semiconductor chip. The method includes forming a first layer stack by alternately stacking first material layers and second material layers over a scribe lane region of a semiconductor substrate, the semiconductor substrate including a chip region and the scribe lane region; forming trenches that substantially penetrate the first layer stack; forming first crack propagation guides that fill the trenches; forming a second layer stack by alternately stacking third material layers and fourth material layers over the first layer stack and the first crack propagation guides; forming openings substantially penetrating the second layer stack; and forming second crack propagation guides that fill the openings.

According to another embodiment of the present disclosure, there is provided a method of manufacturing a semiconductor chip. The method includes forming a first layer stack by alternately stacking first material layers and second material layers over a semiconductor substrate, the semiconductor substrate including a chip region and a scribe lane region; forming first trenches that overlap with the scribe lane region and second trenches that overlap with the chip region, the first and second trenches that substantially penetrate the first layer stack; forming first crack propagation guides that fill the first trenches and insulating pattern that fill the second trenches; forming a second layer stack by alternately stacking third material layers and fourth material layers on the first layer stack; forming first openings that overlap with the scribe lane region and second openings that overlap with the chip region together, the first and second openings substantially penetrating the second layer stack; and forming second crack propagation guides filling the first openings and supporters filling the second openings.

DETAILED DESCRIPTION

Figure 1:
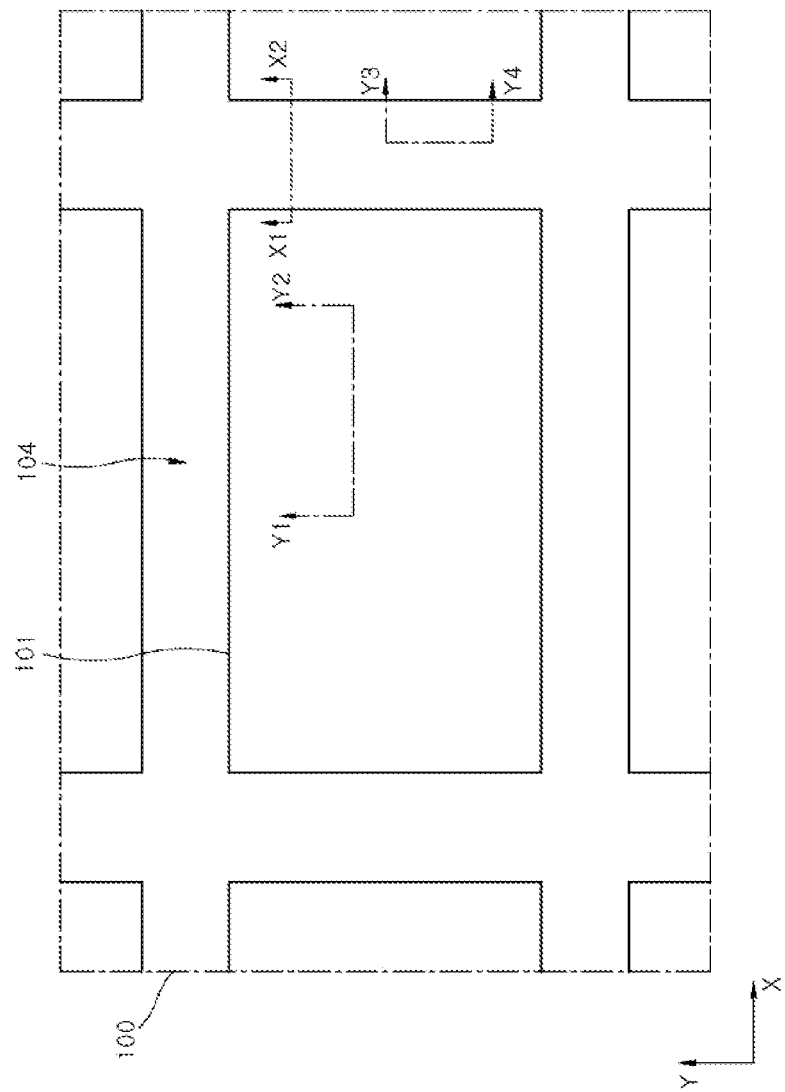
FIG. 1 is a schematic plan view illustrating an arrangement shape of regions of a semiconductor substrate in a method of manufacturing a semiconductor chip according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may indicate a semiconductor package structure in which a structure in which semiconductor substrates are stacked is packaged. The semiconductor substrate may indicate a semiconductor wafer, a semiconductor die, or a semiconductor chip in which electronic components and devices are integrated. The semiconductor chip may indicate memory chips in which memory integrated circuits such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processor such as application processors (Aps), graphic processing units (GPUs), central processing units (CPUs) or system-on-chips (SoCs). The semiconductor devices may be employed in information communication systems such as mobile phones, electronic systems associated with biotechnology or health care, or wearable electronic systems. The semiconductor packages may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIGS. 1 to 19 are views illustrating a method of manufacturing a semiconductor chip according to an embodiment of the present disclosure. FIG. 1 is a schematic plan view illustrating an arrangement shape of regions 101 and 104 of a semiconductor substrate 100 according to an embodiment.

Referring to FIG. 1, the method of manufacturing the semiconductor chip may include a process of cutting or dicing the semiconductor substrate 100 to divide the semiconductor substrate 100 into individual semiconductor chips. A memory device or semiconductor devices may be integrated in or on the semiconductor substrate 100. The semiconductor substrate 100 may include chip regions 101 and a scribe lane region 104. The scribe lane region 104 may be positioned between the chip regions 101 and may be a region that surrounds the chip regions 101. The chip regions 101 may be regions in which semiconductor devices are integrated or located. The chip regions 101 may be regions to be separated into individual semiconductor chips. The scribe lane region 104 may be a region to be cut or diced. The scribe lane region 104 may be disposed in a shape in which some portions that extend in the X-axis direction in the X-Y plane and other portions that extend in the Y-axis direction cross each other.

The process of separating the semiconductor chips with the chip regions 101 from the semiconductor substrate 100 may include a wafer dicing process. The wafer dicing process may be performed by cutting a portion of the scribe lane region 104 with a laser. For example, stealth dicing process may be used in the process of separating the semiconductor chips. By irradiating the portion of the semiconductor substrate 100 corresponding to the scribe lane region 104 with a laser, initial cracks may be generated in the semiconductor substrate 100. The generated cracks may be grown or propagated to dice the semiconductor substrate 100 to separate the semiconductor chips.

Figure 2:
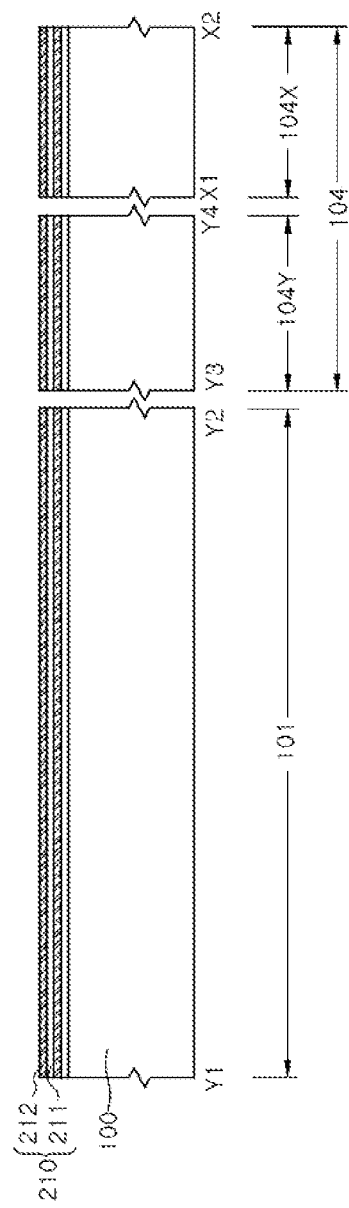
FIG. 2 is a schematic cross-sectional view illustrating a step of forming a first layer stack in a method of manufacturing a semiconductor chip according to an embodiment of the present disclosure.

FIG. 2 is a schematic cross-sectional view illustrating a step of forming a first layer stack 210 according to an embodiment of the present disclosure. The chip region 101 of FIG. 2 may be presented as a cross-sectional region along a cutting line Y1-Y2 of FIG. 1. The scribe lane region 104 of FIG. 2 may be a region including an X-axis cross-sectional region 104X and a Y-axis cross-sectional region 104Y. The X-axis cross-sectional region 104X may represent a cross-sectional shape along a cutting line X1-X2 of FIG. 1. The Y-axis cross-sectional region 104Y may represent a cross-sectional shape along a cutting line Y3-Y4 of FIG. 1.

Referring to FIG. 2, the first layer stack 210 may be formed on the scribe lane region 104 of the semiconductor substrate 100. The first layer stack 210 may be formed on the chip region 101 and the scribe lane region 104. The semiconductor substrate 100 may include the chip region 101 and the scribe lane region 104. The scribe lane region 104 may be a region that surrounds the chip region 101. Active elements, such as transistors, may be formed on the chip region 101 of the semiconductor substrate 100. Memory cells, conductive contacts that are electrically connected to the memory cells, and metal wires may be formed on the chip region 101 of the semiconductor substrate 100. The memory cells may constitute a semiconductor device, such as a three-dimensional (3D) NAND memory device or a 3D nonvolatile memory device.

The first layer stack 210 may be formed by alternately and repeatedly stacking first material layers 211 and second material layers 212. The first material layers 211 or the second material layers 212 may be stacked in several stages. The first material layers 211 or the second material layers 212 may be stacked in 8 layers, for example. The first material layers 211 and the second material layers 212 may be formed of different insulating materials. Each of the first material layers 211 may be formed of silicon oxide ($SiO_2$), and each of the second material layers 212 may be formed of silicon nitride ($Si_3N_4$). The first material layer 211 may be deposited on the semiconductor substrate 100, and the second material layer 212 may be deposited on the first material layers 211. The first layer stack 210 may be formed by repeatedly depositing the first material layer 211 and the second material layer 212.

Figure 3:
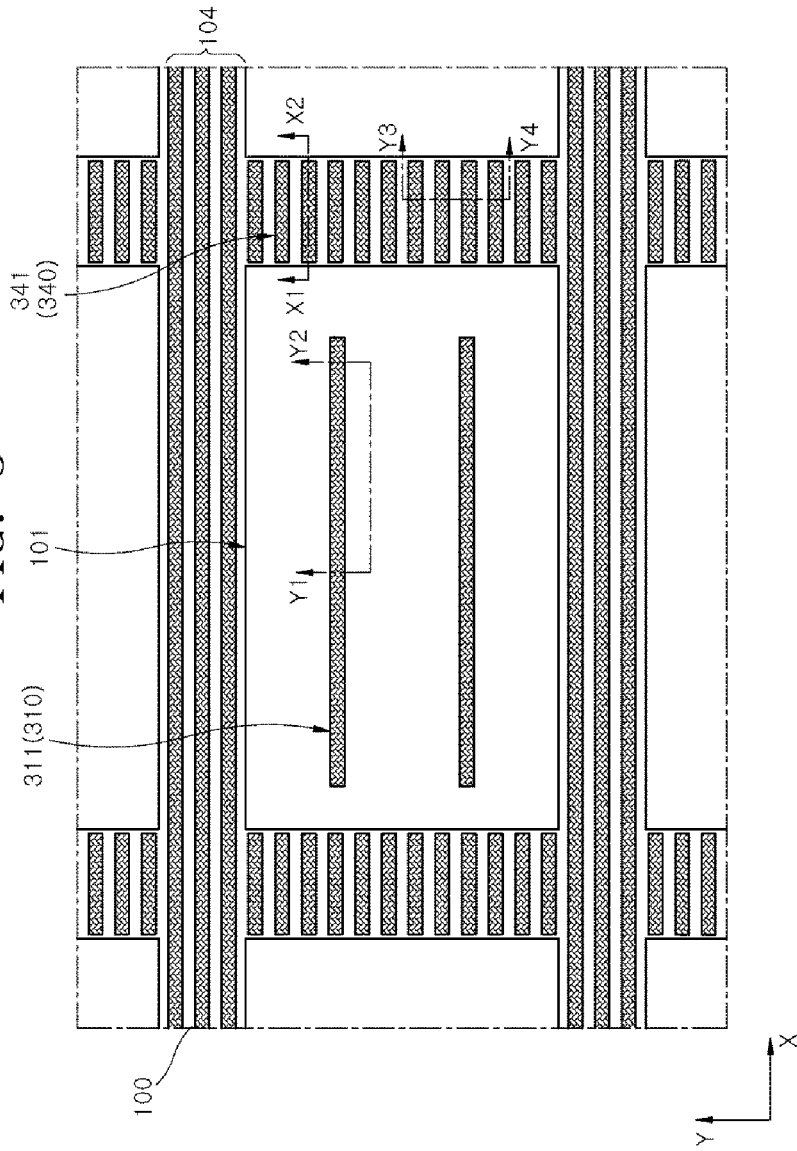
FIG. 3 is a schematic plan view illustrating an arrangement shape of first crack propagation guides in a method of manufacturing a semiconductor chip according to an embodiment of the present disclosure.
Figure 4:
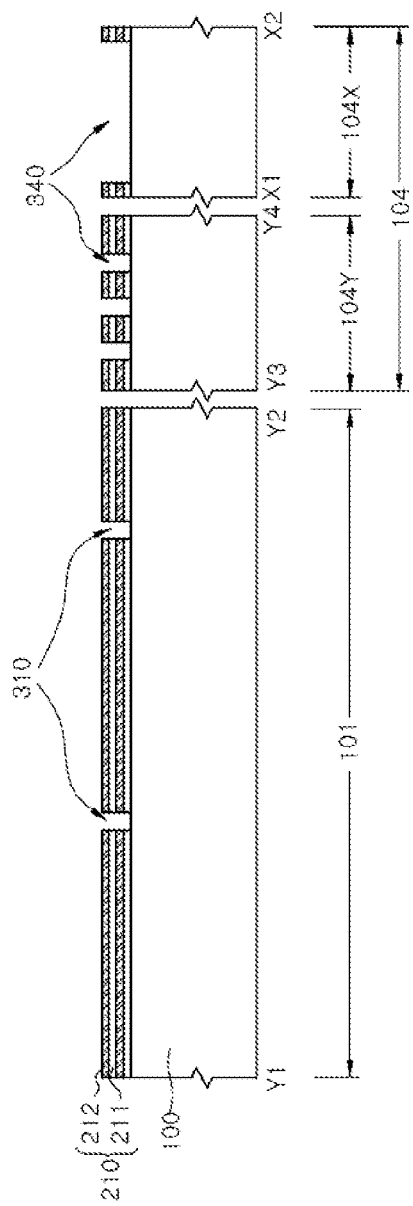
FIG. 4 is a schematic cross-sectional view illustrating a step of forming trenches in a method of manufacturing a semiconductor chip according to an embodiment of the present disclosure.

FIG. 3 is a schematic plan view illustrating an arrangement shape of first crack propagation guides 341 over the semiconductor substrate 100 according to an embodiment of the present disclosure. FIG. 4 is a schematic cross-sectional view illustrating a step of forming first trenches 340 and second trenches 310 in the first layer stack 210 according to an embodiment of the present disclosure.

Referring to FIGS. 3 and 4, the first trenches 340 and the second trenches 310 may be formed to substantially penetrate the first layer stack 210. The first trenches 340 and the second trenches 310 may be formed by selectively etching and removing portions of the first layer stack 210. The first trenches 340 may be formed over the scribe lane region 104 when the second trenches 310 are formed over the chip region 101. The first trenches 340 may be positioned while overlapping with the scribe lane region 104 of the semiconductor substrate 100. The second trenches 310 may be positioned while overlapping with the chip region 101 of the semiconductor substrate 100.

As illustrated in FIG. 3, each of the second trenches 310 may have a shape of a line pattern that extends across the chip region 101 of the semiconductor substrate 100. Each of the second trenches 310 may be formed in a shape that extends in the X-axis direction on the X-Y plane. Each of the first trenches 340 may be formed in the shape of a line pattern that extends long in the X-axis direction substantially the same as the second trench 310. Different number of first trenches 340 may be formed over the scribe lane region 104. The first trenches 340 may be disposed to extend to be parallel to each other. The first trenches 340 may be disposed to be spaced apart from each other in the Y-axis direction, perpendicular to a direction in which the first trenches 340 extend.

Figure 5:
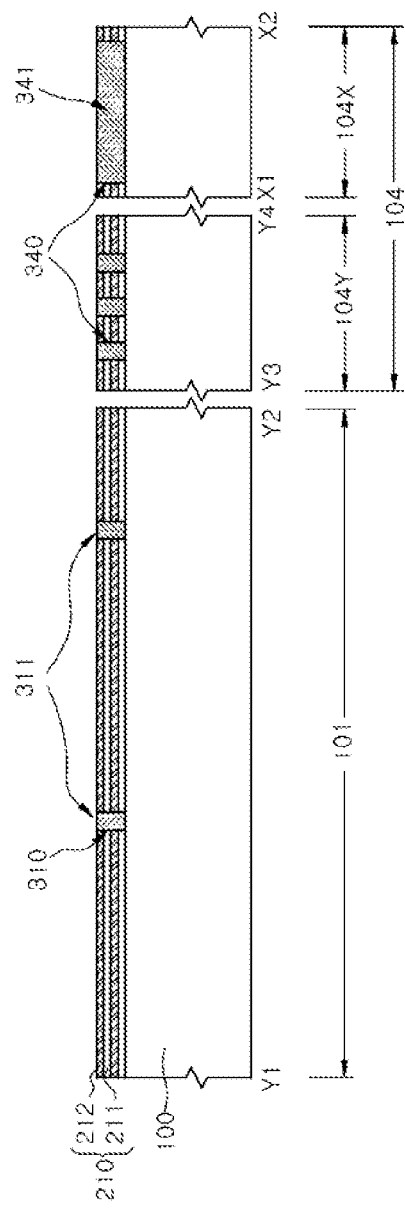
FIG. 5 is a schematic cross-sectional view illustrating a step of forming first crack propagation guides and an insulating pattern in a method of manufacturing a semiconductor chip according to an embodiment of the present disclosure.

FIG. 5 is a schematic cross-sectional view illustrating a step of forming first crack propagation guides 341 and insulating patterns 311 in the first layer stack 210 according to an embodiment of the present disclosure.

Referring to FIGS. 3 and 5, an insulating material layer may be formed to fill the first trenches 340 and the second trenches 310 of the first layer stack 210. Accordingly, the first crack propagation guides 341 may be formed to fill the first trenches 340. When forming the first crack propagation guides 341, the insulating patterns 311 that fill the second trenches 310 may be formed together. The insulating patterns 311 and the first crack propagation guides 341 may be formed of substantially the same insulating material. The insulating patterns 311 and the first crack propagation guides 341 may be formed of silicon oxide.

The insulating patterns 311 may divide a portion of the first layer stack 210 that overlaps with the chip region 101 into a plurality of portions. The plurality of first crack propagation guides 341 may be disposed to be side by side over the scribe lane region 104. Each of the first crack propagation guides 341 may be formed in a shape of a line pattern that extends across the scribe lane region 104.

Figure 6:
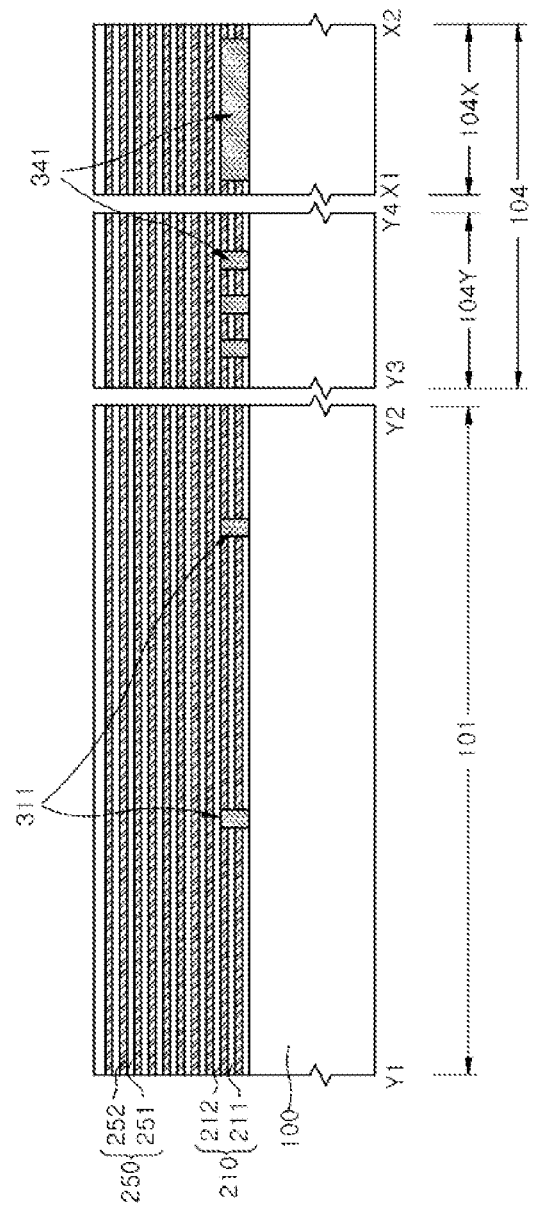
FIG. 6 is a schematic cross-sectional view illustrating a step of forming a second layer stack in a method of manufacturing a semiconductor chip according to an embodiment of the present disclosure.

FIG. 6 is a schematic cross-sectional view illustrating a step of forming a second layer stack 250 according to an embodiment of the present disclosure.

Referring to FIG. 6, the second layer stack 250 may be formed on the first layer stack 210. The second layer stack 250 may be formed to cover the first crack propagation guides 341 and the first layer stack 210. The second layer stack 250 may be formed to cover the insulating patterns 311 over the chip region 101. The second layer stack 250 may be formed by alternately and repeatedly stacking third material layers 251 and fourth material layers 252. The third material layers 251 or the fourth material layers 252 may be stacked in several tens of stages. The third material layers 251 or the fourth material layers 252 may be stacked in several hundreds of stages. The third material layers 251 may include substantially the same insulating material as the first material layer 211, and the fourth material layers 252 may include substantially the same insulating material as the second material layer 212. The third material layers 251 may include silicon oxide ($SiO_2$), and the fourth material layers 252 may be include silicon nitride ($Si_3N_4$).

Figure 7:
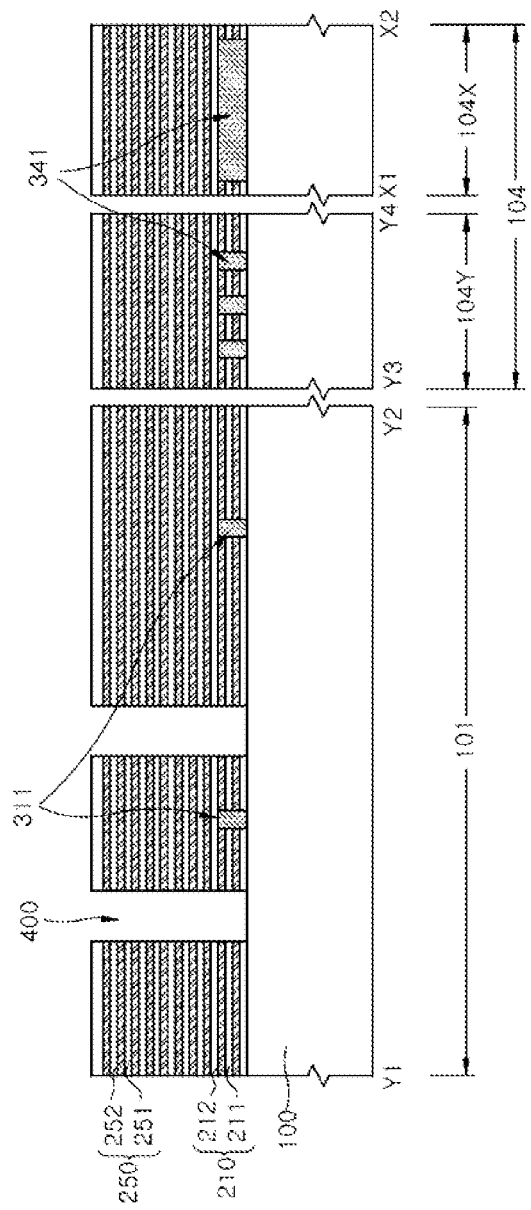
FIG. 7 is a schematic cross-sectional view illustrating a step of forming channel holes in a method of manufacturing a semiconductor chip according to an embodiment of the present disclosure.

FIG. 7 is a schematic cross-sectional view illustrating a step of forming channel holes 400 in the first and second layer stacks 210 and 250 according to an embodiment of the present disclosure.

Referring to FIG. 7, the channel holes 400 that substantially vertically penetrate some portions of the first and second layer stacks 210 and 250 may be formed. The channel holes 400 may be positioned to overlap with the chip region 101 of the semiconductor substrate 100. The channel holes 400 may substantially vertically penetrate the first material layers 211, the second material layers 212, the third material layers 251, and the fourth material layers 252. The channel holes 400 may be formed by selectively etching and removing some portions of the first material layers 211, the second material layers 212, the third material layers 251, and the fourth material layers 252.

Although the channel holes 400 are depicted as being formed to penetrate both the second layer stack 250 and the first layer stack 210 in FIG. 7, each of the channel holes 400 may be divided into a lower channel hole (not illustrated) and an upper channel hole (not illustrated). For example, only some lower layers of the second layer stack 250 may be first formed on the first layer stack 210, and the lower channel holes may be formed through some lower layers of the second layer stack 250. After forming a sacrificial layer (not illustrated) that fills the lower channel holes, other upper layers of the second layer stack 250 may be formed on the lower layers of the second layer stack 250, and the upper channel holes that overlap with the lower channel holes may be formed, thereby forming the channel holes 400 with the lower channel holes and the upper channel holes being connected to each other.

Figure 8:
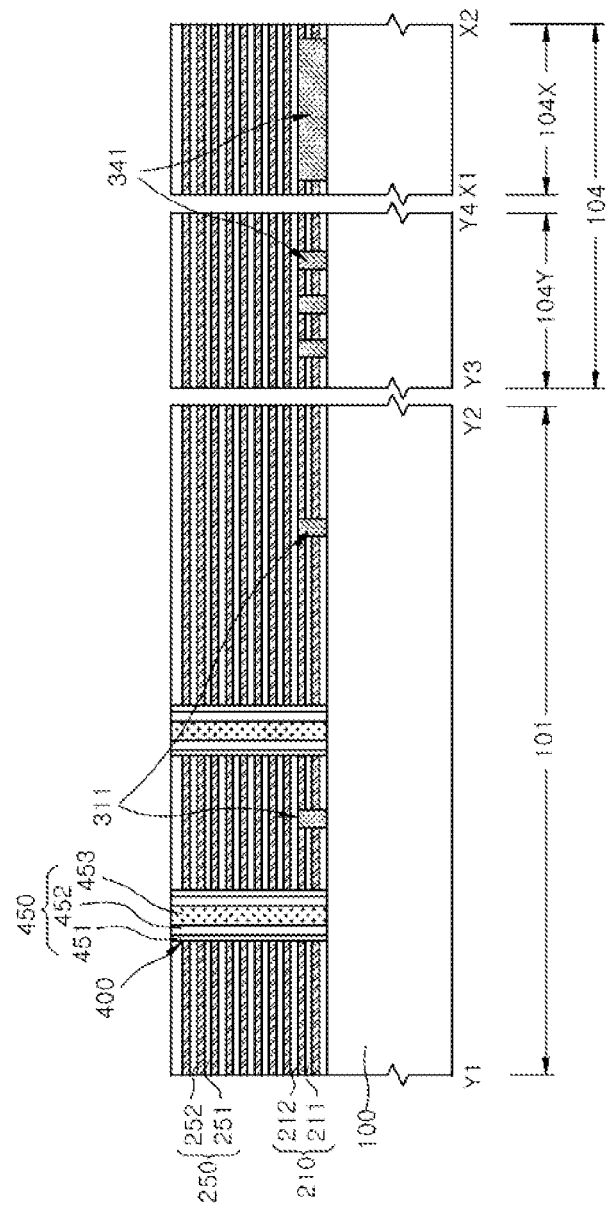
FIG. 8 is a schematic cross-sectional view illustrating a step of forming vertical channel structures in a method of manufacturing a semiconductor chip according to an embodiment of the present disclosure.

FIG. 8 is a schematic cross-sectional view illustrating a step of forming vertical channel structures 450 according to an embodiment of the present disclosure.

Referring to FIG. 8, a memory layer 451, a channel layer 452, and a filler 453 may be sequentially formed on a sidewall of each of the channel holes 400. The memory layer 451 may be a layer that traps electric charges to store data.

The memory layer 451 may include a tunneling layer through which electric charges tunnel, a charge trap layer that traps electric charges, and a charge blocking layer that blocks electric charge transfer. The tunnel layer may be positioned between the charge trap layer and the channel layer 452. The tunnel layer may include silicon oxide. The charge trap layer may include silicon nitride. The charge blocking layer may include silicon oxide. The memory layer 451 may include a multilayer structure of silicon oxide-silicon nitride-silicon oxide. The memory layer 451 may be formed as a layer capable of storing data, such as a phase change material layer, a nano dot layer, or a ferroelectric material layer.

The channel layer 452 may include a semiconductor material including silicon (Si). Each of the channel layer 452 and the memory layer 451 may be formed as a thin film compared to the filler 453. The channel layer 452 and the memory layer 451 might not completely fill the channel hole 400. The filler 453 may be formed as a layer that substantially fill the rest of the channel hole 400 that the channel layer 452 and the memory layer 451 did not fill. The filler 453 may include an insulating material, such as silicon oxide.

Figure 9:
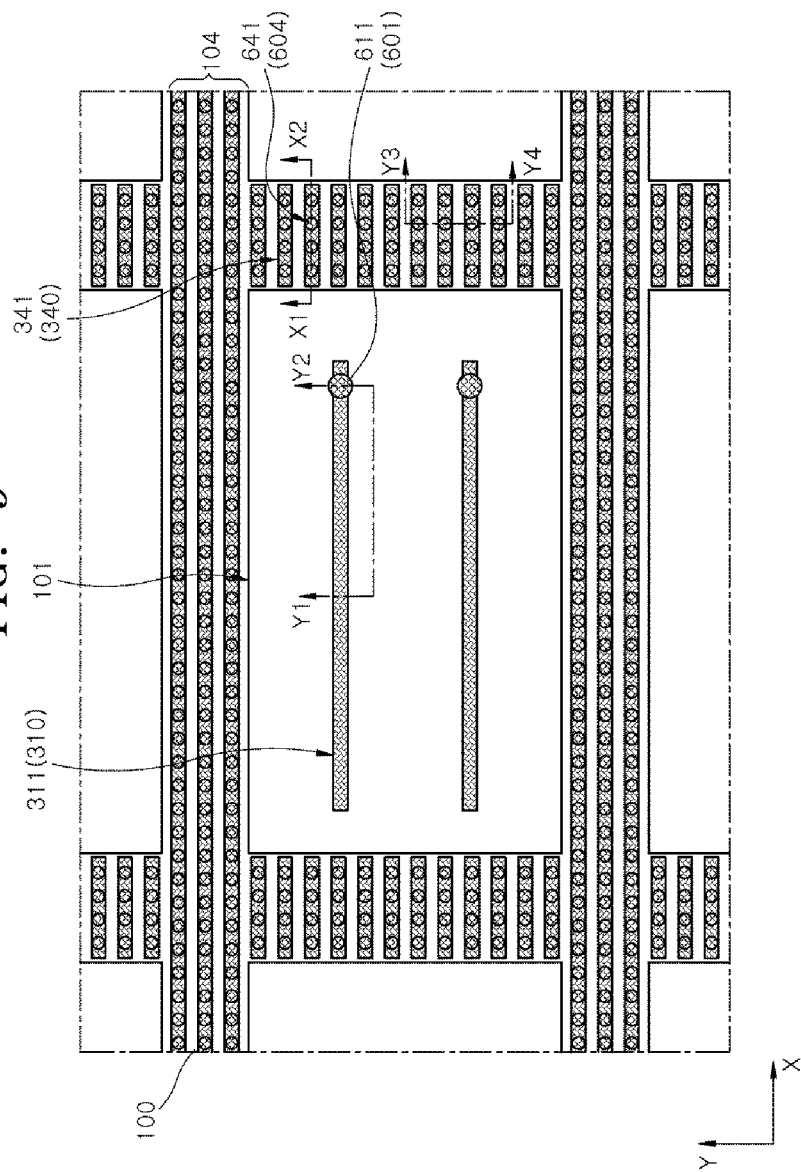
FIG. 9 is a schematic plan view illustrating an arrangement shape of second crack propagation guides in a method of manufacturing a semiconductor chip according to an embodiment of the present disclosure.
Figure 10:
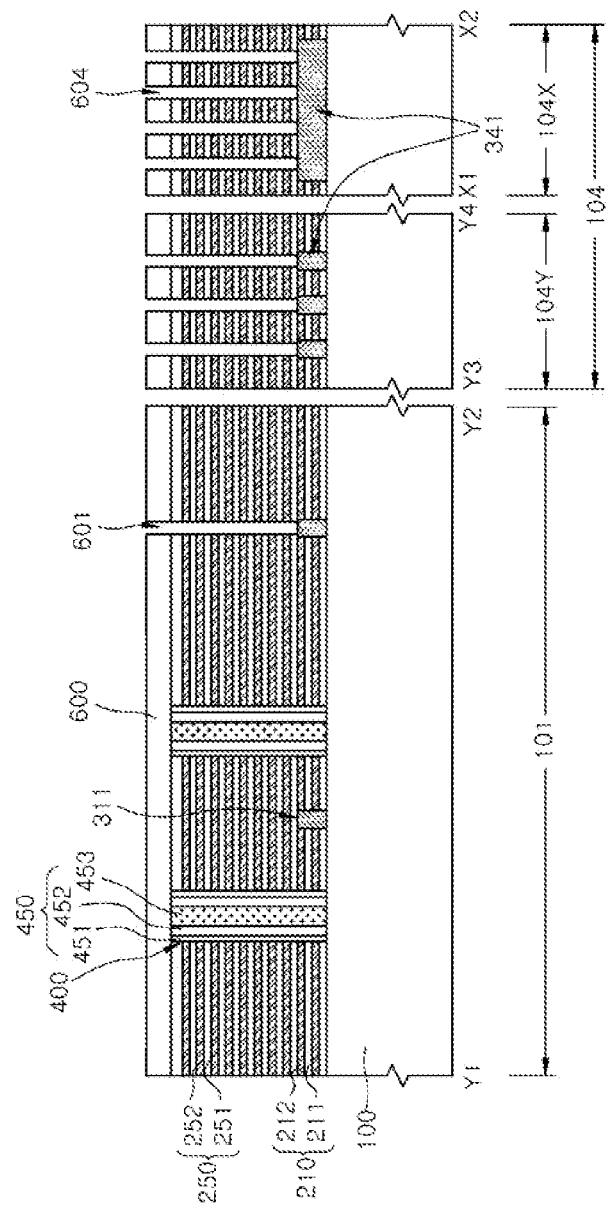
FIG. 10 is a schematic cross-sectional view illustrating a step of forming openings in a method of manufacturing a semiconductor chip according to an embodiment of the present disclosure.

FIG. 9 is a schematic plan view illustrating an arrangement shape of second crack propagation guides 641 over the semiconductor substrate 100 according to an embodiment of the present disclosure. FIG. 10 is a schematic cross-sectional view illustrating a step of forming first openings 604 and second openings 601 in the second layer stack 250 according to an embodiment the present disclosure.

Referring to FIGS. 9 and 10, the first openings 604 and the second openings 601 may be formed to substantially penetrate the second layer stack 250. A first insulating layer 600 may be formed on the second layer stack 250, and some portions of the first insulating layer 600 and some portions of the second layer stack 250 may be selectively etched or removed to form the first and second openings 604 and 601. The first openings 604 may be formed while overlapping with the scribe lane region 104 of the semiconductor substrate 100. The second openings 601 may be formed while overlapping with the chip region 101 of the semiconductor substrate 100. In the process of forming the second openings 601, the first openings 604 may be formed together. Each of the second openings 601 and first openings 604 may be formed in a shape of a through hole that penetrates the second layer stack 250.

The second openings 601 may be formed to overlap with some portions of the insulating patterns 311. Each of the second openings 601 may be formed to overlap with an end portion of each of the insulating patterns 311. Each of the second openings 601 may be formed to expose a portion of the end of each of the insulating patterns 311. Each of the first openings 604 may be formed to overlap with a portion of each of the first crack propagation guides 341. Each of the first openings 604 may be formed to expose a portion of each of the first crack propagation guides 341. The plurality of first openings 604 may be formed to overlap with the first crack propagation guides 341.

Figure 11:
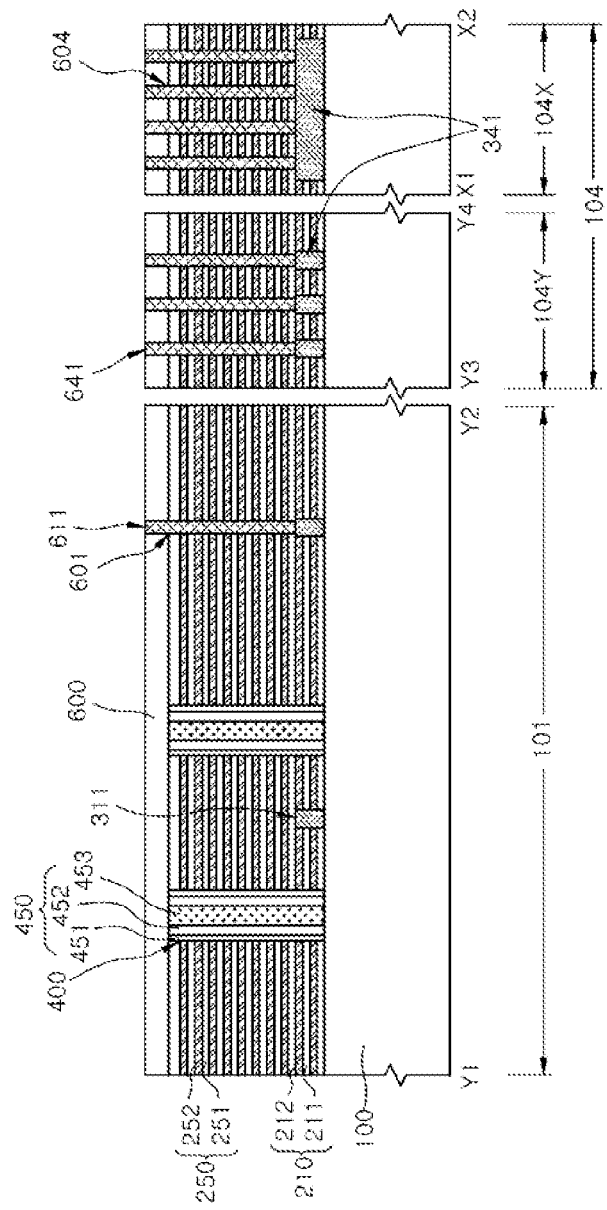
FIG. 11 is a schematic cross-sectional view illustrating a step of forming second crack propagation guides in a method of manufacturing a semiconductor chip according to an embodiment of the present disclosure.

FIG. 11 is a schematic cross-sectional view illustrating a step of forming second crack propagation guides 641 according to an embodiment of the present disclosure.

Referring to FIGS. 9 and 11, the second crack propagation guides 641 filling the first openings 604 may be formed. Supporters 611 filling the second openings 601 may be formed together with the second crack propagation guides 641. The first openings 604 and the second openings 601 may be filled with an insulating material to form the second crack propagation guides 641 and the supporters 611 that are made of the insulating material. The second crack propagation guides 641 and the supporters 611 may be formed of substantially the same insulating material. The second crack propagation guides 641 and the supporters 611 may include silicon oxide. The plurality of second crack propagation guides 641 may overlap with the first crack propagation guides 341. The supporters 611 may overlap with portions of the insulating patterns 311.

Figure 12:
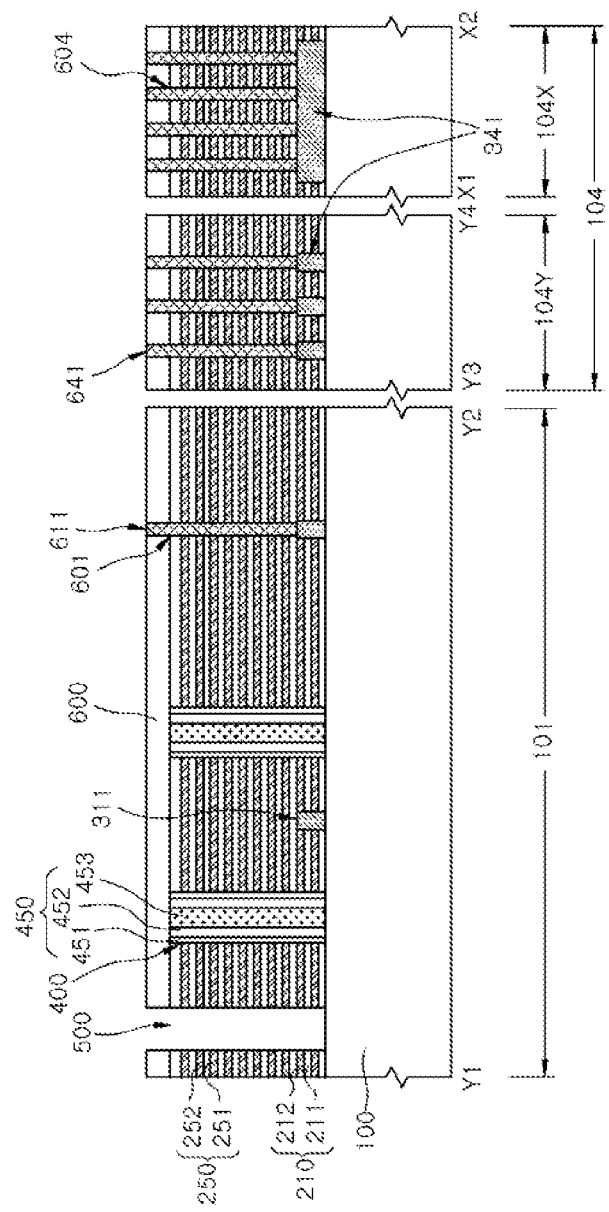
FIG. 12 is a schematic cross-sectional view illustrating a step of forming a slit in a method of manufacturing a semiconductor chip according to an embodiment of the present disclosure.

FIG. 12 is a schematic cross-sectional view illustrating a step of forming a slit 500 according to an embodiment of the present disclosure.

Referring to FIG. 12, the slit 500 may be formed to substantially vertically penetrate the first insulating layer 600, the second layer stack 250, and the first layer stack 210. The slit 500 may be formed in a shape that extends in substantially the same direction as the direction in which the insulating patterns 311 are extended. The slit 500 may be formed to divide the layer stacks 210 and 250 into blocks with the plurality of vertical channel structures 450. The slit 500 may be formed to be positioned between the vertical channel structures 450.

Figure 13:
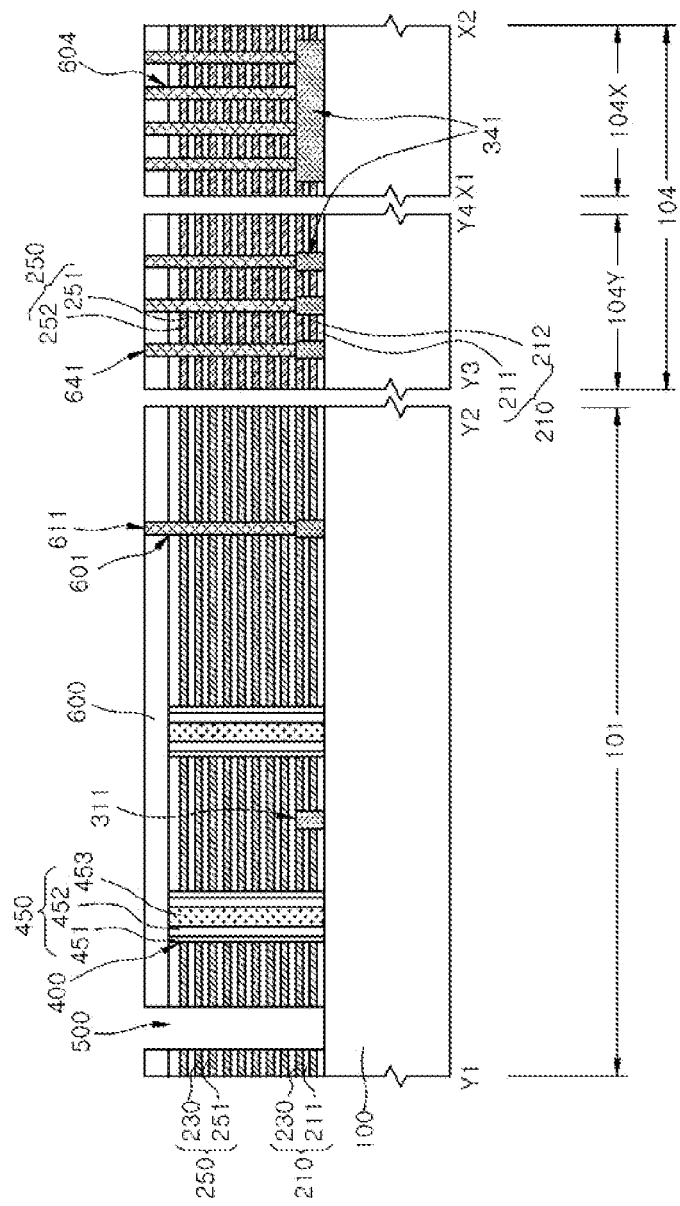
FIG. 13 is a schematic cross-sectional view illustrating a step of forming conductive layers in a method of manufacturing a semiconductor chip according to an embodiment of the present disclosure.

FIG. 13 is a schematic cross-sectional view illustrating a step of forming conductive layers 230 according to an embodiment of the present disclosure.

Referring to FIGS. 12 and 13, some portions of the second material layers 212 of the first layer stack 210 and some portions of the fourth material layers 252 of the second layer stack 250 may be replaced with the conductive layer 230. Some portions of the second material layers 212 that are positioned over the chip region 101 of the semiconductor substrate 100 may be replaced with the conductive layers 230. Some portions of the fourth material layers 252 that are positioned over the chip region 101 may be replaced with the conductive layers 230. Other portions of the second material layers 212 that are positioned over the scribe lane region 104 of the semiconductor substrate 100 may be maintained as the second material layers 212. Other portions of the fourth material layers 252 that are positioned over the scribe lane region 104 of the semiconductor substrate 100 may be maintained as the fourth material layers 252.

As the slit 500 is formed, the side surfaces of the second material layers 212 of the first layer stack 210 may be exposed to the side surface of the slit 500. The side surfaces of the fourth material layers 252 of the second layer stack 250 may be exposed to the side surface of the slit 500. The portions of the second material layers 212 and the portions of the fourth material layers 252 that are positioned over the chip region 101 may be selectively etched and removed through the slit 500. The slit 500 may be used as a passage through which the portions of the second material layers 212 and the portions of the fourth material layers 252 are removed. The portions of the first material layer 211 and the portions of the third material layer 251 that are positioned in the spaces from which the portions of the second material layer 212 and the portions of the fourth material layer 252 are removed may be maintained without collapsing due to the insulating patterns 311 and the supporters 611. The vertical channel structure 450 may support and maintain the portions of the first material layers 211 and the portions of the third material layers 251 together with the supporters 611 and the insulating patterns 311.

The portions of the second material layers 212 and the portions of the fourth material layers 252 that are positioned over the scribe lane region 104 may be maintained without being etched. An insulating layer (not illustrated) that separates the scribe lane region 104 and the chip region 101 may be formed so that the portions of the second material layers 212 and the portions of the fourth material layers 252 that are positioned over the scribe lane region 104 are maintained.

The conductive layers 230 may be formed to fill the portions from which the second and fourth material layers 212 and 252 are removed. The conductive layers 230 may be formed as word lines. A conductive material may be deposited through the slit 500 so that the spaces in which the second material layers 212 and the fourth material layers 252 are removed may be filled with the conductive material. The conductive layer 230 may include a metal material, such as tungsten (W).

The structure including the memory layer 451 and the channel layer 452 of the vertical channel structure 450 and the conductive layer 230 may constitute a memory cell structure. The memory cell structure may form a vertically repeated structure or a string structure over the semiconductor substrate 100. The conductive layer 230 may be used as a gate electrode for the channel layer 452. The conductive layers 230 may be used as word lines for memory cell structures. The conductive layers 230 that are positioned in the first layer stack 210 may be used as source select lines SSL. Some of the conductive layers 230 in the second layer stack 250 may be used as drain select lines DSL.

Meanwhile, a peripheral circuit portion (not illustrated) may be disposed between the semiconductor substrate 100 and the first layer stack 210. The peripheral circuit portion may include a peripheral circuit that controls the memory cells formed over the semiconductor substrate 100. The peripheral circuit portion may be formed in a peri under cell (PUC) structure that is positioned under the cell.

Figure 14:
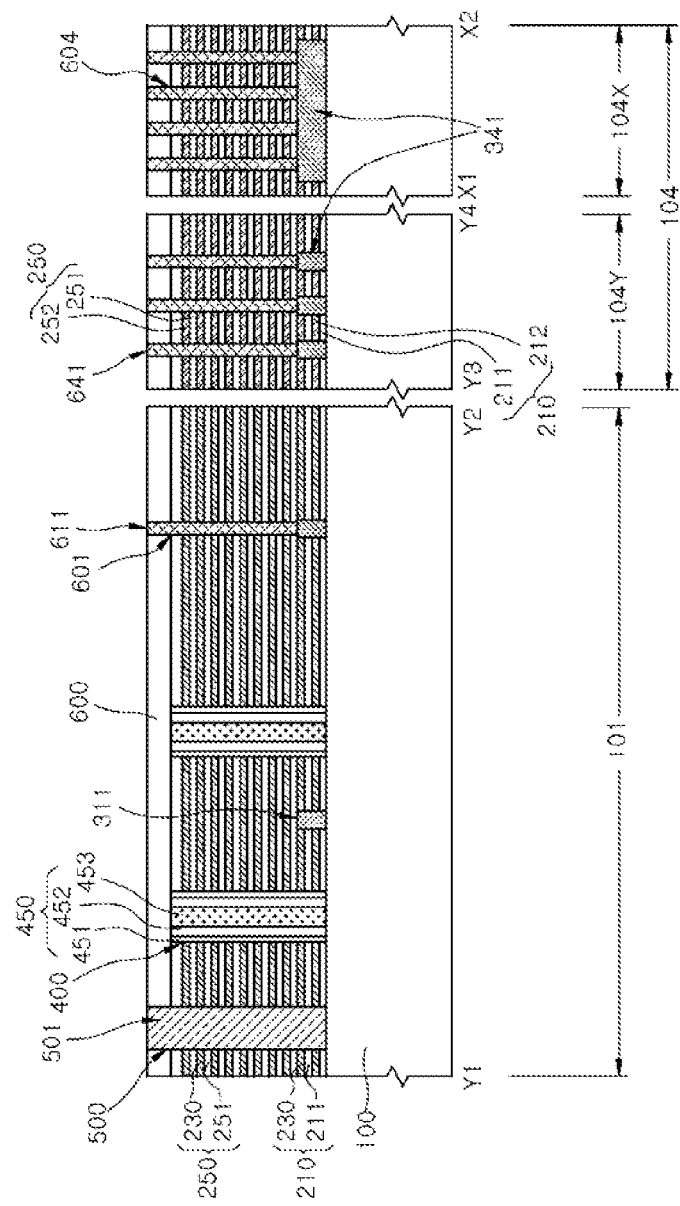
FIG. 14 is a schematic cross-sectional view illustrating a step of forming a slit pattern in a method of manufacturing a semiconductor chip according to an embodiment of the present disclosure.

FIG. 14 is a schematic cross-sectional view illustrating a step of forming a slit pattern 501 according to an embodiment of the present disclosure.

Referring to FIG. 14, the slit pattern 501 may be formed to fill the slit 500. The slit pattern 501 may be formed of an insulating material such as silicon oxide.

Figure 15:
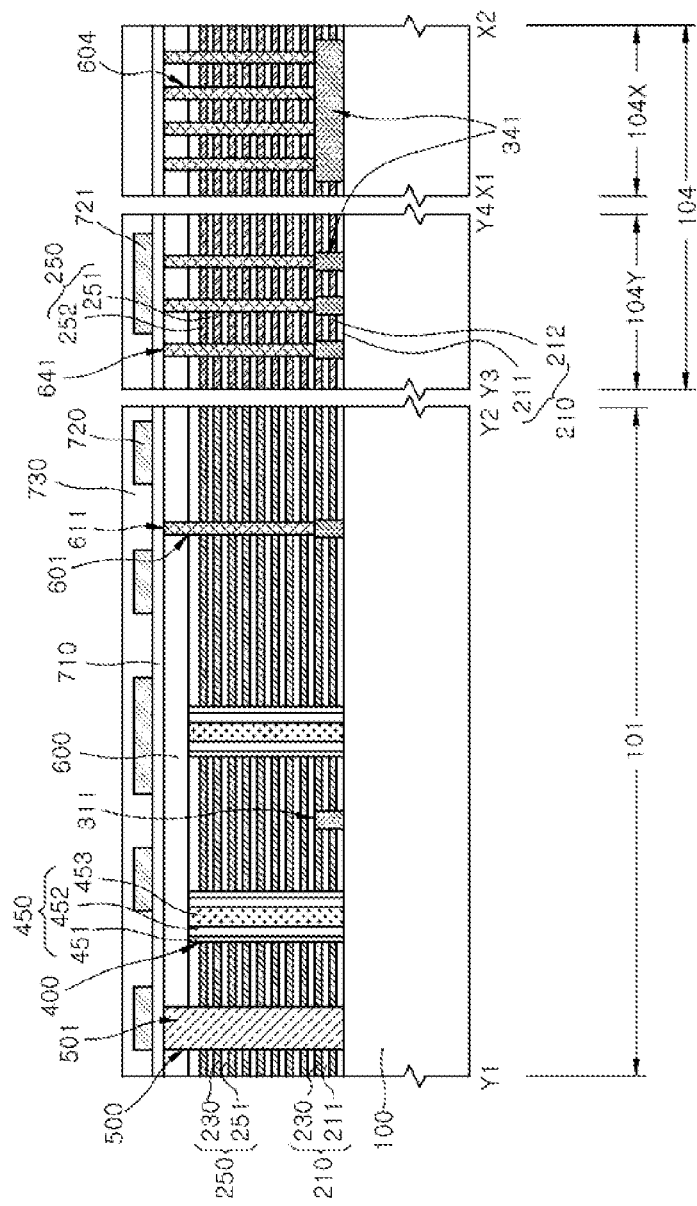
FIG. 15 is a schematic cross-sectional view illustrating a step of forming a test pattern in a method of manufacturing a semiconductor chip according to an embodiment of the present disclosure.

FIG. 15 is a schematic cross-sectional view illustrating a step of forming a test pattern 721 according to an embodiment of the present disclosure.

Referring to FIG. 15, a second insulating layer 710 covering the first insulating layer 600, the slit pattern 501, and the supporters 611 may be formed. A process of forming a wiring structure on the second insulating layer 710 may be performed. Conductive patterns 720 and the test pattern 721 may be formed by depositing and patterning a conductive layer on the second insulating layer 710. Each of the conductive patterns 720 may be formed in a multilayer wiring structure. The conductive patterns 720 may be positioned over the chip region 101 of the semiconductor substrate 100.

Some of the conductive patterns 720 may be electrically connected to the channel layer 452 of the vertical channel structure 450 through conductive contacts. Other portions of the conductive patterns 720 may be electrically connected to the conductive layers 230 through other conductive contacts.

The test pattern 721 may be positioned over the scribe lane region 104 of the semiconductor substrate 100. The test pattern 721 may be formed as a probing pad for electrically testing the memory cells that are formed over the semiconductor substrate 100. The test pattern 721 may be positioned to overlap with some of the second crack propagation guides 641.

A passivation layer 730 that covers the conductive patterns 720 and the test pattern 721 may be formed. The passivation layer 730 may be formed to expose some portions of the test pattern 721 and the conductive patterns 720.

Figure 16:
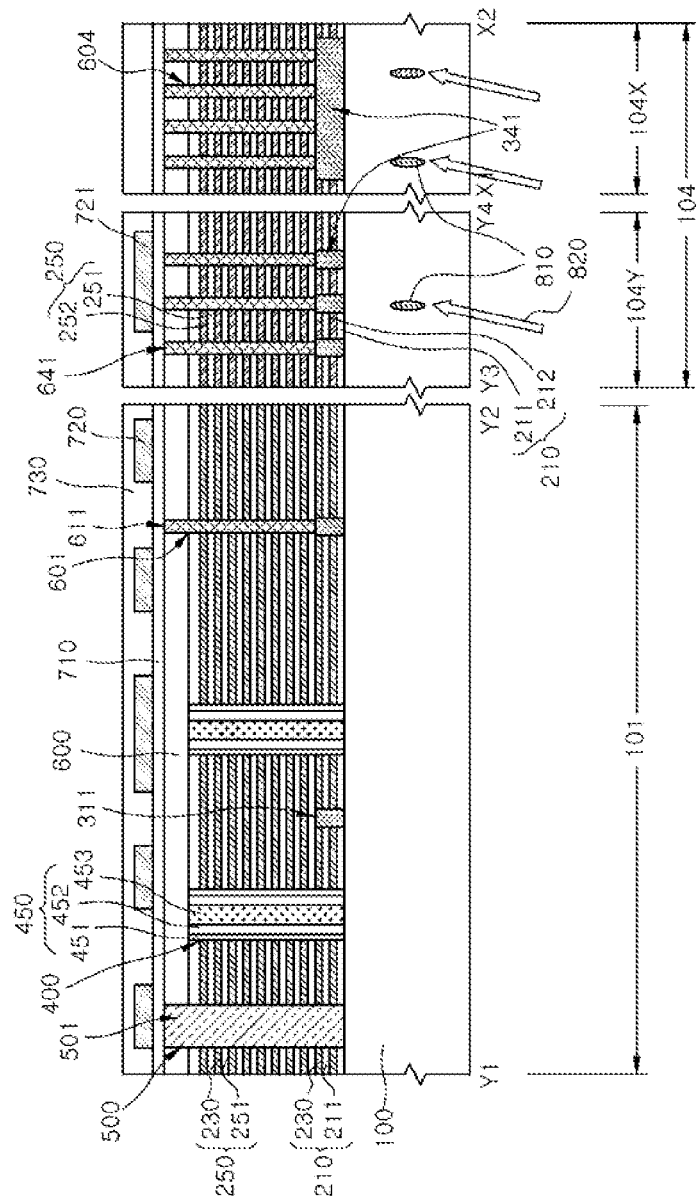
FIG. 16 is a schematic cross-sectional view illustrating a step of generating cracks in a method of manufacturing a semiconductor chip according to an embodiment of the present disclosure.

FIG. 16 is a schematic cross-sectional view illustrating a step of generating cracks 810 according to an embodiment of the present disclosure.

Referring to FIG. 16, a laser 820 may be focused to irradiate some portions of the semiconductor substrate 100 of the scribe lane region 104 to generate initial cracks 810. The laser-irradiated portions of the semiconductor substrate 100 may be modified by the laser 820, and the cracks 810 may be generated in the laser-irradiated portions of the semiconductor substrate 100 by the stress caused by the modification.

The laser 820 may irradiate the portions of the semiconductor substrate 100 so that the plurality of cracks 810 may be generated at regular intervals along the scribe lane region 104. The process of generating the cracks 810 by the laser 820 may be performed by a wafer dicing process known as the stealth dicing process. The cracks 810 may be generated at positions overlapping with the first crack propagation guides 341. The cracks 810 may be generated at positions that overlap with some of the second crack propagation guides 641.

Figure 17:
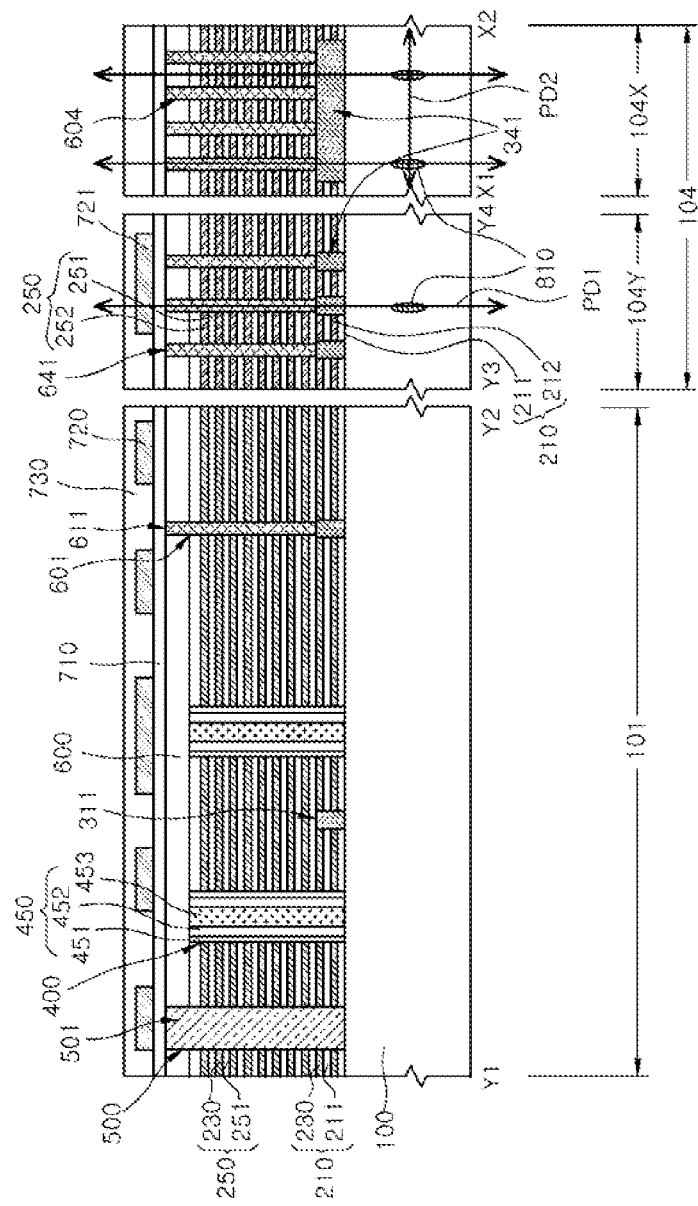
FIG. 17 is a schematic cross-sectional view illustrating the propagation of cracks in a method of manufacturing a semiconductor chip according to an embodiment of the present disclosure.

FIG. 17 is a schematic cross-sectional view illustrating propagation of the cracks 810 according to an embodiment of the present disclosure.

Referring to FIG. 17, the cracks 810 may grow or propagate in a direction substantially perpendicular to the semiconductor substrate 100. The cracks 810 may grow and propagate in the direction substantially perpendicular to the semiconductor substrate 100 by expanding the semiconductor substrate 100 in both lateral directions.

The cracks 810 may be guided to preferentially grow or propagate in a first crack propagation direction PD1 based on the first and second crack propagation guides 341 and 641. The first and second crack propagation guides 341 and 641 may guide the cracks 810 to proceed in the first crack propagation direction PD1 that is substantially perpendicular to the semiconductor substrate 100. Based on the first and second crack propagation guides 341 and 641, the cracks 810 may propagate through the first and second crack propagation guides 341 and 641 in a substantially vertical direction.

An interface between the first material layer 211 and the second material layer 212 of the first layer stack 210 may act as a factor that prevents the cracks 810 from propagating in the vertical direction. An interface between the third material layer 251 and the fourth material layer 252 of the second layer stack 250 may act as a factor that prevents the cracks 810 from propagating in the vertical direction. Accordingly, the cracks 810 may be blocked at the interface between the first material layer 211 and the second material layer 212 of the first layer stack 210 and at the interface between the third material layer 251 and the fourth material layer 252 of the second layer stack 250 and may undesirably proceed or propagate in the horizontal direction along those interfaces.

However, because the first and second crack propagation guides 341 and 641 vertically penetrate the layer stacks 210 and 250, the first and second crack propagation guides 341 and 641 may provide vertical paths through which the cracks 810 may preferentially propagate. Accordingly, the cracks 810 may preferentially propagate vertically through the first and second crack propagation guides 341 and 641 rather than proceeding along the interface between the first material layer 211 and the second material layer 212 of the first layer stack 210 and the interface between the third material layer 251 and the fourth material of the second layer stack 250. Accordingly, defects in which the cracks 810 cannot divide the layer stacks 210 and 250 may be effectively prevented or reduced.

Figure 18:
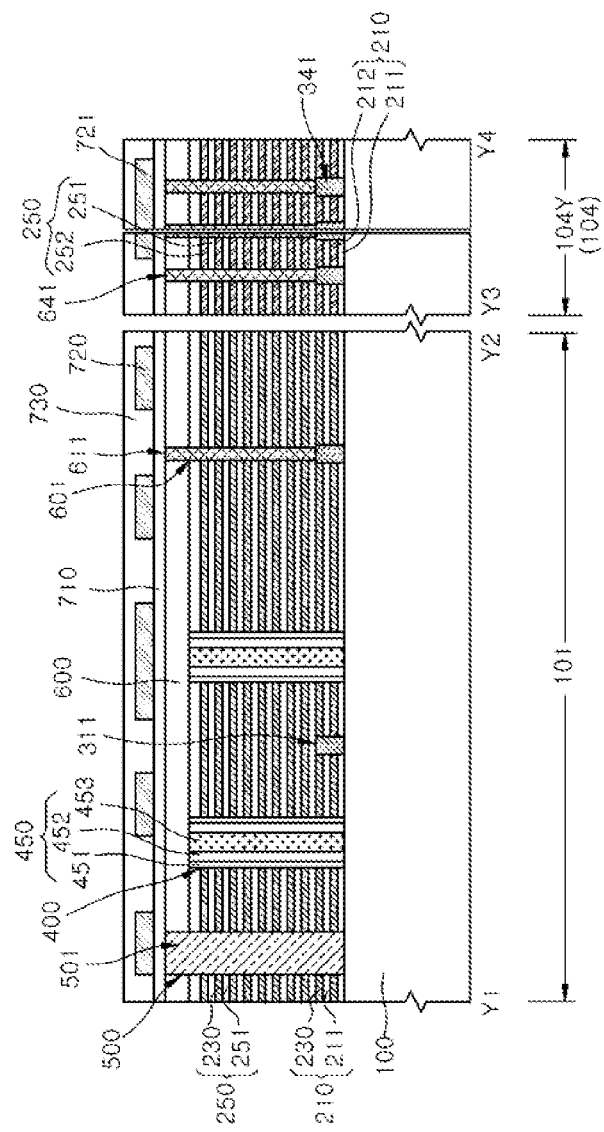
FIG. 18 is a schematic cross-sectional view illustrating a step of dicing a semiconductor substrate in a method of manufacturing a semiconductor chip according to an embodiment of the present disclosure.
Figure 19:
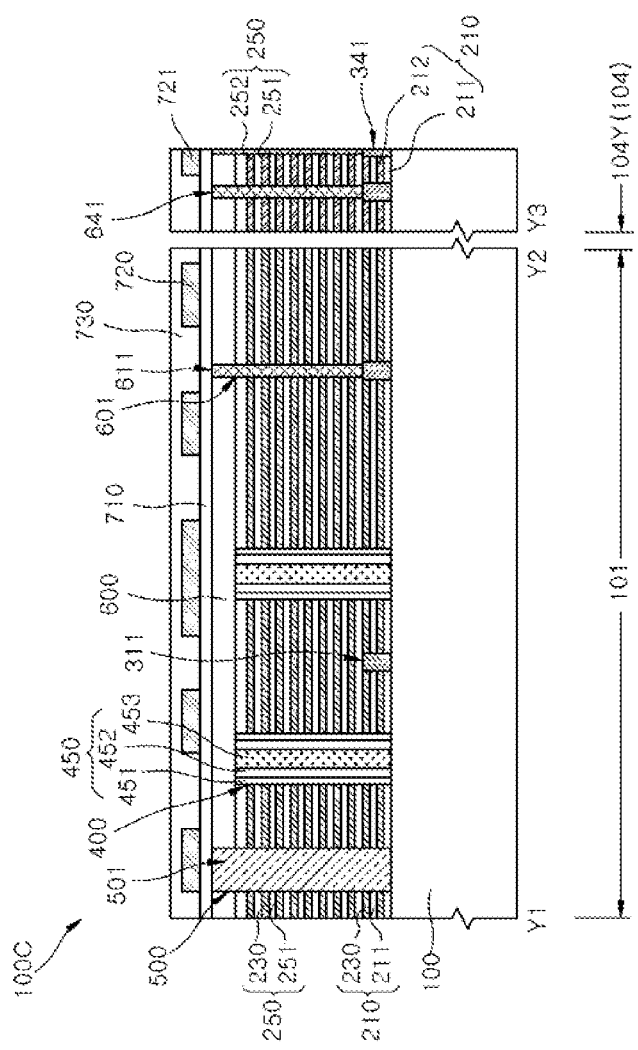
FIG. 19 is a schematic cross-sectional view illustrating a semiconductor chip diced by a method of manufacturing a semiconductor chip according to an embodiment of the present disclosure.

FIG. 18 is a schematic cross-sectional view illustrating a step of dicing the semiconductor substrate 100 according to an embodiment of the present disclosure. FIG. 19 is a schematic cross-sectional view illustrating a semiconductor chip 100C separated from the semiconductor substrate 100 according to an embodiment of the present disclosure.

Referring to FIGS. 17 and 18, the cracks 810 may also proceed in a second crack propagation direction (PD2 in FIG. 17), which is the horizontal direction, so as to be connected to other neighboring cracks 810. As described, the cracks 810 may propagate in the vertical and horizontal directions in the scribe lane region 104 of the semiconductor substrate 100 and may dice the semiconductor substrate 100. Accordingly, the semiconductor chip 100C as illustrated in FIG. 19 may be separated from the semiconductor substrate 100.

Figure 20:
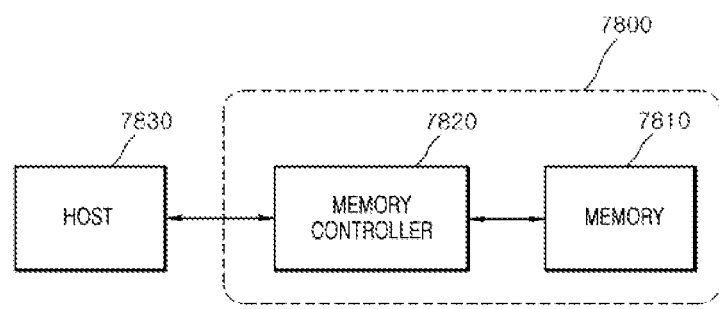
FIG. 20 is a block diagram illustrating an electronic system employing a memory card including a package according to an embodiment of the present disclosure.

FIG. 20 is a block diagram illustrating an electronic system including a memory card 7800 employing at least one of the semiconductor packages according to the embodiments. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 21:
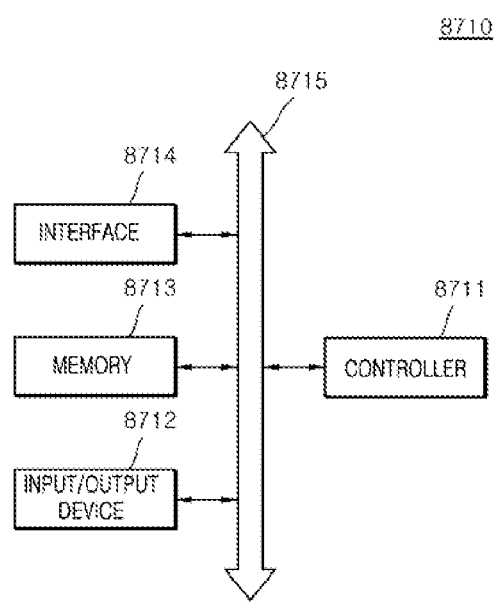
FIG. 21 is a block diagram illustrating an electronic system including a package according to an embodiment of the present disclosure.

FIG. 21 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A method of manufacturing a semiconductor chip, the method comprising;
   forming a first layer stack by alternately stacking first material layers and second material layers over a scribe lane region of a semiconductor substrate, the semiconductor substrate including a chip region and the scribe lane region;
   forming trenches that substantially penetrate the first layer stack;
   forming first crack propagation guides that fill the trenches;
   forming a second layer stack by alternately stacking third material layers and fourth material layers on the first layer stack and the first crack propagation guide;
   forming openings substantially penetrating the second layer stack; and
   forming second crack propagation guides that fill the opening.

2. The method of claim 1, further comprising
   generating cracks in a portion of the scribe lane region of the semiconductor substrate; and
   separating the semiconductor chip with the chip region from the semiconductor substrate by propagating the cracks.

3. The method of claim 2, wherein the first and second crack propagation guides induce the propagation direction of the cracks to be substantially perpendicular to the semiconductor substrate.

4. The method of claim 2, wherein the cracks propagate vertically through the first and second crack propagation guides.

5. The method of claim 2, wherein generating the cracks includes irradiating the portion of the scribe lane region of the semiconductor substrate with a laser.

6. The method of claim 1, wherein a plurality of second crack propagation guides are overlapped with the first crack propagation guides.

7. The method of claim 1, wherein the plurality of first crack propagation guides are arranged side by side in the scribe lane region of the semiconductor substrate.

8. The method of claim 1, wherein the first crack propagation guides include line patterns that are elongated across the scribe lane region of the semiconductor substrate.

9. The method of claim 1, wherein the opening is formed to expose portions of the first crack propagation guides.

10. The method of claim 1, wherein each of the openings has a through-hole shape.

11. The method of claim 1, wherein the first material layer includes silicon oxide, and
wherein the second material layer includes silicon nitride.

12. The method of claim 1, wherein the third material layer includes silicon oxide, and
wherein the fourth material layer includes silicon nitride.

13. The method of claim 1, wherein the first and third material layers include the same insulating material,
wherein the second and fourth material layers include the same insulating material, and
wherein the first and second material layers include different insulating materials.

14. The method of claim 1, wherein each of the first crack propagation guides includes an insulating material.

15. The method of claim 1, wherein each of the first crack propagation guides includes silicon oxide.

16. The method of claim 1, wherein each of the second crack propagation guides includes an insulating material.

17. The method of claim 1, further comprising:
forming an insulating layer that covers the second crack propagation guides and the second layer stack;
forming a test pattern on the insulating layer; and
forming a passivation layer that covers the test pattern.

18. A method of manufacturing a semiconductor chip, the method comprising:
forming a first layer stack by alternately stacking first material layers and second material layers over a semiconductor substrate, the semiconductor substrate including a chip region and a scribe lane region;
forming first trenches that overlap with the scribe lane region and second trenches that overlap with the chip region, the first and second trenches that substantially penetrate the first layer stack;
forming first crack propagation guides that fill the first trenches and insulating patterns that fill the second trenches;
forming a second layer stack by alternately stacking third material layers and fourth material layers on the first layer stack;
forming first openings that overlap with the scribe lane region and second openings that overlap with the chip region together, the first and second openings substantially penetrating the second layer stack; and
forming second crack propagation guides that fill the first openings and supporters filling the second openings.

19. The method of claim 18, wherein each of the supporters and second crack propagation guides includes an insulating material.

20. The method of claim 18, wherein the second openings and the supporters overlap with some portions of the insulating pattern.

21. The method of claim 18, further comprising:
selectively removing portions of the second and fourth material layers that overlap with the chip region, the third and first material layers being supported by the supporters and the insulating pattern, the portions of the second and fourth material layers that overlap with the scribe lane region being maintained; and
filling portions from which the second and fourth material layers are removed with conductive layers for word lines.

22. The method of claim 21, further comprising forming a slit that substantially penetrates the first and second layer stacks and overlaps with the chip region,
wherein the slit provides a passage through which the second and fourth material layers are removed.

23. The method of claim 18, further comprising:
forming a channel hole that substantially penetrates the first and second layer stacks and overlaps with the chip region; and
forming a memory layer, a channel layer, and a filler on a sidewall of the channel hole.

24. The method of claim 23,
wherein the memory layer includes a tunnel layer, a charge trap layer, and a charge blocking layer,
wherein the channel layer includes a semiconductor material, and
wherein the filler includes an insulating material.

25. The method of claim 18, wherein a plurality of second crack propagation guides overlap with the first crack propagation guides.

26. The method of claim 18, wherein the plurality of first crack propagation guides are arranged side by side in the scribe lane region of the semiconductor substrate.

27. The method of claim 18, wherein the first crack propagation guides include line patterns that are elongated across the scribe lane region of the semiconductor substrate.

28. The method of claim 18, wherein the first openings are formed to expose portions of the first crack propagation guides.

29. The method of claim 18, wherein each of the first openings has a through-hole shape.

30. The method of claim 18, wherein the first material layer includes silicon oxide, and
wherein the second material layer includes silicon nitride.

31. The method of claim 18, wherein the third material layer includes silicon oxide, and
wherein the fourth material layer includes silicon nitride.

32. The method of claim 18, wherein the first and third material layers include the same insulating material,
wherein the second and fourth material layers include the same insulating material, and
wherein the first and second material layers include different insulating materials.

33. The method of claim 18, wherein the first crack propagation guides include silicon oxide.

34. The method of claim 18, further comprising:
forming an insulating layer that covers the second crack propagation guides and the second layer stack;
forming a conductive pattern and a test pattern on the insulating layer; and
forming a passivation layer that covers the conductive pattern and the test pattern.

* * * * *